(12) United States Patent
Engel et al.

(10) Patent No.: US 9,018,589 B2
(45) Date of Patent: Apr. 28, 2015

(54) DIRECT CONVERSION X-RAY DETECTOR

(75) Inventors: Klaus Jurgen Engel, Aachen (DE);
Christoph Herrmann, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 116 days.

(21) Appl. No.: 13/991,462

(22) PCT Filed: Dec. 2, 2011

(86) PCT No.: PCT/IB2011/055430
§ 371 (c)(1),
(2), (4) Date: Jun. 4, 2013

(87) PCT Pub. No.: WO2012/077023
PCT Pub. Date: Jun. 14, 2012

(65) Prior Publication Data
US 2013/0256541 A1    Oct. 3, 2013

(30) Foreign Application Priority Data
Dec. 7, 2010    (EP) .................................... 10193895

(51) Int. Cl.
*G01T 1/24* (2006.01)
*H01L 31/0224* (2006.01)
(Continued)

(52) U.S. Cl.
CPC .............. *H01L 31/0224* (2013.01); *G01T 1/24* (2013.01); *G01T 1/247* (2013.01); *H01L 31/18* (2013.01); *H01L 27/14676* (2013.01)

(58) Field of Classification Search
CPC ................ H01L 31/0224; H01L 31/18; H01L 27/14676; G01T 1/247
USPC ....................... 250/370.01; 257/432
See application file for complete search history.

(56) References Cited

U.S. PATENT DOCUMENTS 5,821,539 A    10/1998    Matz et al.
6,344,650 B1 *    2/2002    Lee et al. .................. 250/370.01
(Continued)

FOREIGN PATENT DOCUMENTS

JP    01077969 A    3/1989

OTHER PUBLICATIONS

Eskin, J. D., et al.; Signals induced in semiconductor gamma-ray imaging detectors; 1999; Journal of Applied Physics; 85(2)647-659.
(Continued)

*Primary Examiner* — David Porta
*Assistant Examiner* — Meenakshi Sahu

(57) ABSTRACT

The invention relates to a radiation detector (100) comprising a converter element (102) for converting incident high-energy radiation (X) into charge signals. A cathode (101) and an array (104) of anodes (103) are disposed on different sides of the converter element (102) for generating an electrical field ($E_0$, $E_d$) within it. The strength of said electrical field ($E_0$, $E_d$) is increased in a first region ($R_d$) near the anode array (104) with respect to a second region ($R_0$) remote from it. Such an increase may be achieved by doping the first region ($R_d$) with an electron acceptor. The increased field strength in the first region ($R_d$) favorably affects the sharpness of charge pulses generated by incident radiation.

20 Claims, 2 Drawing Sheets

(51) Int. Cl.
*H01L 31/18* (2006.01)
*H01L 27/146* (2006.01)

(56) References Cited

U.S. PATENT DOCUMENTS

| | | |
|---|---|---|
| 6,541,836 B2 | 4/2003 | Iwanczyk et al. |
| 7,161,155 B1 | 1/2007 | Deych |
| 2004/0007671 A1* | 1/2004 | Sipila et al. .............. 250/370.01 |
| 2008/0001092 A1* | 1/2008 | Yokoi et al. .............. 250/370.01 |
| 2009/0184251 A1 | 7/2009 | Karim et al. |
| 2009/0200478 A1* | 8/2009 | Bethke .................... 250/370.09 |

OTHER PUBLICATIONS

Halmagean, E., et al.; Radiation Detectors Obtained Using Neutron Transmutation Doped (NTD) Silicon; 1992; Proc. of SPIE-Intl. Soc. for Optical Ingineering; vol. 1734:287-294.

* cited by examiner

DIRECT CONVERSION X-RAY DETECTOR

FIELD OF THE INVENTION

The invention relates to a detector for the detection of high-energy radiation, to an examination apparatus comprising such a radiation detector, and to a method for manufacturing such a radiation detector.

BACKGROUND OF THE INVENTION

From the U.S. Pat. No. 5,821,539 A1 a radiation detector is known comprising a direct conversion material in which incident high-energy rays are converted into movable electrical charges (electrons and holes). In order to remove charges that have been trapped in the converter material, an "injection electrode" is provided additionally to a conventional cathode and anode. It is mentioned that the metals of the electrode materials may diffuse into the adjacent converter material, thus generating a negative doping therein.

SUMMARY OF THE INVENTION

Based on this background it was an object of the present invention to provide means that allow for the detection of high-energy radiation with improved reliability.

This object is achieved by a radiation detector including a) a converter element for converting incident high-energy radiation (X) into charge signals: b) a cathode and an array of anodes disposed on different sides of the converter element for generating an electrical field (E0, Ed) in the converter element; and the converter element has a spatial inhomogeneity by which the strength of said electrical field (E0, Ed) is increased in a first region (Rd) near the anode array and/or decreased in a second region (R0) remote from the anode array, an apparatus particularly a photon-counting energy resolved X-ray apparatus or CT scanner including the radiation detector, and a manufacturing method for the radiation detector including the following steps: a) providing a substrate that can convert high-energy radiation (X) into charge signals; b) doping said substrate inhomogeneously; and c) applying a cathode and an array of anodes onto different sides of the substrate.

Preferred embodiments are disclosed in the dependent claims.

According to its first aspect, the invention relates to a radiation detector for the detection of high-energy radiation, i.e. of (X-ray or γ-) photons with an energy higher than about 100 eV. The radiation detector comprises the following components:
a) A "converter element" for converting incident high-energy radiation into charge signals, e.g. into electron-hole pairs in the conduction resp. valence band of the converter material.
b) At least one first electrode and at least one array with second electrodes disposed on different sides of the aforementioned converter element, particularly on opposite sides thereof. The first electrode will in the following be called "cathode" and a second electrode will be called "anode", in reference to the typical relative voltage they are operated with. However, these terms shall not exclude other operation modes, i.e. the application of any arbitrary voltage/polarity between an "anode" and the "cathode" shall be comprised by the present invention. Moreover, the "array of anodes" may comprise, as an extreme case, just a single anode, though it will typically be made up of a plurality of separate anodes. The cathode and anodes can generate an electrical field in the converter element when a voltage is applied to them (preferably the same voltage between the cathode and each anode of the array).

Furthermore, the converter element shall be designed with a spatial inhomogeneity by which the strength of the aforementioned electrical field is increased in a first region near the anode array and/or decreased in a second region remote from the anode array. This feature can be explained with other words as follows: If the converter element would be homogeneous, a voltage applied between cathode and anode array would result in a "standard" electrical field within the volume filled by the converter element. By replacing this homogenous converter element with a converter element that has an inhomogeneous design according to the invention, the "standard" electrical field is increased in the first region and/or decreased in the second region.

The inhomogeneity of the converter element may particularly concern its (chemical) composition, but also its shape; the converter element may for example comprise cavities that affect the field distribution. Most preferably, the field strength is affected such that it becomes higher in the first region than in the second region.

The described radiation detector relates to a method for the detection of high-energy radiation comprising the following steps:
a) Applying a voltage between a cathode and anodes of an array of anodes, wherein said cathode and said array are disposed on different sides of a converter element.
b) Affecting the electrical field that results from the aforementioned voltage to become inhomogeneous, particularly increased in a first region near the anode array and/or decreased in a second region remote from the anode array.
c) Converting incident high-energy radiation within the converter element into charge signals.

The described radiation detector and the method make use of an electrical field strength in a converter element that is increased near an anode array and/or lowered remote from it. Examinations show that this has a positive effect on the accuracy with which incident high-energy photons can be detected. In particular, charge pulses generated by such photons are sharpened, thus allowing a more reliable detection of single pulses and an increased maximum count rate when the detector is used for pulse counting, as described in more detail below.

In a typical embodiment of the radiation detector, each single cathode is paired with a (regular or irregular) array comprising a plurality of anodes. Charge signals arriving at different anodes of an array can then separately be read out, thus allowing for a spatially resolved detection of incident radiation.

The cathode and the array of anodes will preferably cover areas of substantially the same size. Thus a typical design can be realized in which the converter element is sandwiched between a single (large) cathode and the array of (small) anodes. Usually, such a design would result in a completely homogeneous electrical field within the converter element. In the context of the present invention, this homogeneity is however broken by increasing the field strength near the anode array and/or decreasing it remote from the array.

In another embodiment of the invention, the electrical field that is generated in the converter element by a voltage between the cathode and the anode array is substantially perpendicular to the cathode and/or to the anode array. Such an electrical field is for example generated in the aforementioned sandwich design when a cathode and an anode array of equal size are disposed on opposite sides of a cuboid-shaped converter element. Moreover, this embodiment shows that the present invention is not primarily concerned with changing the direction of an electrical field, but rather with altering its magnitude.

Preferably, the electrical field that is generated in the converter element by a voltage between the cathode and the anode array runs perpendicular to the planes defined by the cathode to the anode array, respectively. To put it differently, the electrical field shall be uniform within planes parallel to the cathode or the anode array.

In a preferred embodiment, the first region near the array of anodes covers substantially the "relevant" zones of the anode weighting potentials. The "weighting potential" of a considered anode is the normalized electrical potential (normalized by the electric potential of the anode) that results if said anode is put to a given high potential (e.g. unity) while all other electrodes (the cathode and the other anodes of the array, if present) are kept at ground potential (cf. J. D. Eskin, H. H. Barrett, and H. B. Barber: "Signals induced in semiconductor gamma-ray imaging detectors", Journal of Applied Physics 85 (2), 647-659, 1999). By definition, the weighting potential is dimensionless and thus 1 at the pixel anode, and 0 at all other electrodes. We define the "relevant zone of a weighting potential" for a considered anode as the region in which the weighting potential is higher than 0.5, preferably higher than 0.1. As will be explained in more detail below, increasing the electrical field strength in said zone of weighting potentials can positively affect the electrical pulses that are generated by the radiation detector.

According to the invention, a modification of the electrical field strength in a first region and/or a second region of a converter element is achieved by passive means, i.e. by an appropriate design of the converter element. This design may especially comprise the chemical composition of the converter element. In a preferred embodiment of the invention, the converter element comprises for example a (homogenous) substrate that is inhomogeneously doped with at least one dopant.

The concentration of the aforementioned dopant may particularly be higher in the first region near the anode array than in the second region remote from this. Alternatively, the concentration of the dopant may be higher in the second region remote from the anode array than in the first region near this array.

The concentration of the dopant may preferably be homogeneous in the first region and/or in the second region. Moreover, the concentration of the dopant in the first or in the second region may particularly be zero, meaning that effectively only one of the first and the second region is doped.

In a preferred embodiment, the mentioned dopant may be an electron-acceptor (i.e. p-doping). Doping the first region near the anode array with such an electron-acceptor results, during operation of the radiation detector, in an accumulation of a negative space charge in this first region, which increases the local strength of the electrical field. It is however also comprised by the present invention that the dopant may be a donor (i.e. n-doping). This is for example useful if the pixel electrode is intended to collect holes instead of electrons, i.e. the array of pixel electrodes is an array of cathodes and the opposite electrode is an anode. By means of a positive space charge the strength of the electric field is increased near the array of cathodes.

The dopant may particularly be a chemical element selected from the groups I, II, III, IV, V, VI and VII from the periodic table, like for example Lithium (Li), Beryllium (Be), Boron (B), Carbon (C), Nitrogen (N), Oxygen (O) and Fluorine (F).

The substrate of the converter element, which is doped with the dopant, may preferably comprise a semiconducting material selected from the group consisting of pure group IV-elements (like silicon (Si), Selenium (Se), or Germanium (Ge), semiconducting compounds from the types I-VII (like sodium iodide (NaI)), II-VI (like Cadmium Telluride (CdTe) or Cadmium-Zinc-Telluride ($Cd_xZn_{1-x}Te$ or CZT)), III-V (like Gallium Arsenide (GaAs), or IV-VI (like Lead Oxide (PbO)). Most preferred, the substrate consists of a semiconductor with high X-ray or γ-ray absorption capabilities and high charge mobilities as for example CdTe and CZT.

The radiation detector will usually comprise a readout unit for reading out charge signals generated in the converter element. The readout unit will typically be coupled to the cathode and (individually) to the anodes of the anode array. Moreover, the readout unit is preferably adapted for a spectrally resolved pulse counting, i.e. it can count charge pulses generated by (single) incident photons and it can determine the charge integral of these pulses, which is related to the energy of the incident photons. The spectral resolution and the pulse counting will particularly gain from the favorable pulse shapes generated in a radiation detector according to the present invention.

The invention further relates to an examination apparatus for the examination of an object (e.g. a patient) with radiation, said apparatus comprising a radiation detector of the kind described above. The examination apparatus may particularly be applied as a baggage inspection apparatus, a material testing apparatus, a material science analysis apparatus, an astronomical apparatus, or a medical application apparatus. The examination apparatus may especially be selected from the group consisting of an X-ray apparatus (e.g. a fluoroscopic device), Computed Tomography (CT) imaging system (most preferably a photon-counting Spectral CT imaging system), Coherent Scatter Computed Tomography (CSCT) imaging system, Positron Emission Tomography (PET) imaging system, and Single Photon Emission Computerized Tomography (SPECT) imaging system.

Moreover, the invention relates to a method for manufacturing a radiation detector, said method comprising the following steps:
a) Providing a substrate that is suited for converting high-energy radiation into charge signals.
b) Doping said substrate inhomogeneously.
c) Applying a cathode and an array of anodes onto different sides of the substrate.

With the described method, a radiation detector of the kind described above can be manufactured. Reference is therefore made to the above description for more information on the details, advantages, and modifications of this method. For example, the dopant may be an electron-acceptor, and/or it may be applied in a first region near the anode array.

BRIEF DESCRIPTION OF THE DRAWINGS

These and other aspects of the invention will be apparent from and elucidated with reference to the embodiment(s) described hereinafter. These embodiments will be described by way of example with the help of the accompanying drawings in which.

DESCRIPTION OF PREFERRED EMBODIMENTS

Figure 1:
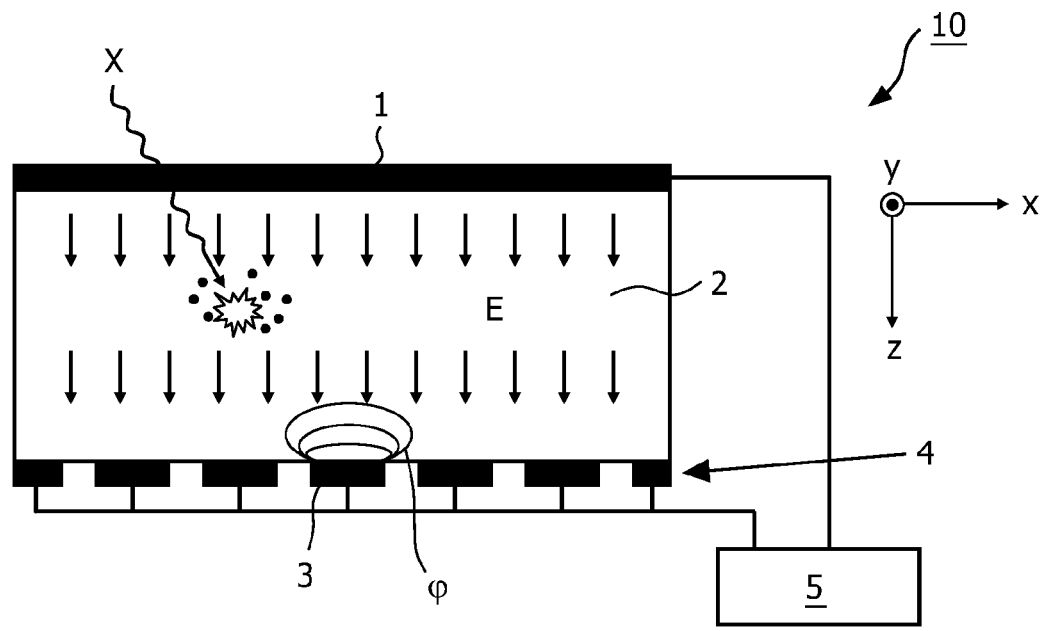
FIG. 1 schematically shows a cross section through a radiation detector according to the state of the art.

Energy resolving detectors for X-ray and gamma radiation based on direct converter materials, as for example CdTe or CZT, can efficiently measure photon energies. FIG. 1 schematically illustrates a side view of such a conventional direct conversion radiation detector 10. The direct converter detector 10 comprises a "converter element" 2, i.e. a block of semiconductor material, located between a cathode 1 and an array 4 of anodes 3. A (high) voltage is applied to these electrodes by a readout unit 5. An incident photon X creates a number of electron/hole pairs. Thereafter, the electrons drift to the array 4 of anode pixels at the "bottom" side, while holes drift to the cathode 1. It is important to note, that already during the drift of the charge carriers a current is induced into the pixel anodes due to capacitive coupling (and not, as one might think at first glance, at the time of arrival of the charges at the collecting anode). The currents in the pixel anodes are read out and evaluated by a readout unit 5.

A current pulse $I_j(t)$ generated in a pixel j by a charge carrier having a charge q and a trajectory (t) across the direct converter is calculated analytically by the formula $$I_j(t) = q \cdot \nabla \phi_j(\vec{r}(t)) \cdot \dot{\vec{r}}(t),$$

wherein $\nabla \phi_j(\vec{r}(t))$ represents the gradient of the weighting potential (also known as weighting field) of the j-th pixel at the charge position $\vec{r}(t)$, and $\dot{\vec{r}}(t)$ represents the velocity vector of the charge (cf. Eskin, above). The formula shows that the current (i.e. the pulse height) is the larger, the stronger the gradient of the weighting potential is (i.e. the closer the charge is to the anode), and the faster the charge moves. In practice, it is known that mainly the electrons contribute to the current pulse as soon as they closely approach the anode ("small pixel effect", cf. Eskin, above).

Besides of the weighting potential, the second significant quantity is the velocity of an electron as soon as it approaches the anode. It is strongly coupled to the electric field E at the electron position by $$\dot{\vec{r}}(t) = \mu_e \cdot E(\vec{r}),$$

wherein $\mu_e$ represents the electron mobility.

As shown in FIG. 1, detectors are typically built in a plate capacitor geometry. This means that the electric field E is perpendicular to the electrode planes along a z-direction. In this case, the above formulas can be simplified and the current $I_j(t)$ induced into the j-th pixel anode is given by $$I_j(t) = q\mu_e \cdot \left. \frac{\partial \varphi_j(\vec{r}')}{\partial z} \right|_{\vec{r}' = \vec{r}(t)} \cdot E_z(z)\big|_{z=r_z(t)}$$

wherein $r_z(t)$ represents the z-coordinate (or depth) of the electron trajectory, and $E_z(r_z(t))$ represents the z-component of the electric field at the charge position.

Typically one aims for highest possible maximum count rates. The maximum count rate is technically limited by the width of the electron pulses, as near the maximum count rate pulses superpose each other increasingly (known as "pile-up effect"). A smaller pulse width reduces the occurrence of pile-up and provides thus an improved spectral performance. Furthermore, sharper pulses (i.e. with lower width but larger pulse height) can be detected more reliably and therefore improve the spectral resolution.

It is therefore proposed to optimize the electric field within the converter element, particularly by a dedicated doping profile of acceptors (i.e. p-doping). If applied near the anodes, ionized acceptors will create a negative space charge, which results in an increased electric field near the anodes. As a result, electrons are speeding up just before entering the anode, which shortens the effectively measured peak width and increases the peak height.

Figure 2:
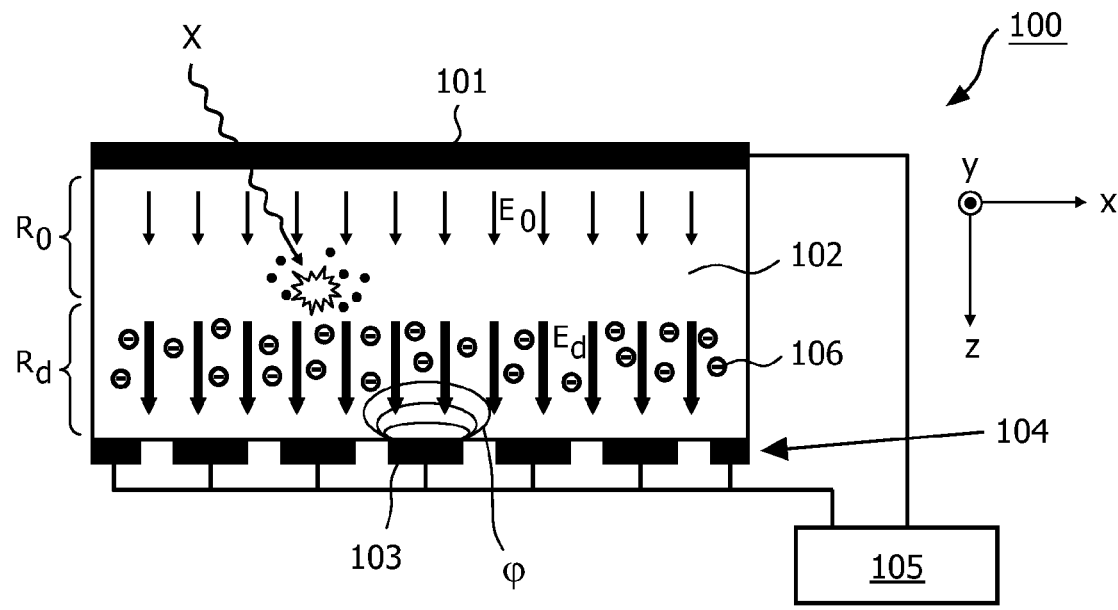
FIG. 2 schematically shows a comparable cross section through a radiation detector according to the present invention.

FIG. 2 illustrates a radiation detector 100 that is designed according to the above principles. Components that are the same as in FIG. 1 are indicated by reference numbers increased by 100 and need not be explained again.

The essential difference with respect to the radiation detector of FIG. 1 is that the converter element 102 is p-doped with electron-acceptors in a first region $R_d$ that extends adjacent to the array 104 of anodes 103, while a second region $R_0$ remote from the anode array remains undoped. The first region $R_d$ covers approximately the relevant zone of the pixel weighting potentials $\phi$ (e.g. quantified as the zone in which $\phi(\vec{r}) \geq 0.1$), while the second region $R_0$ covers the residual volume of the converter element 102. The negatively charged dopant atoms in the doped first region $R_d$ increase the strength of the local electrical field to a value $E_d$, which is higher than the electrical field strength $E_0$ in the second region $R_0$ near the cathode 101.

Figure 3:
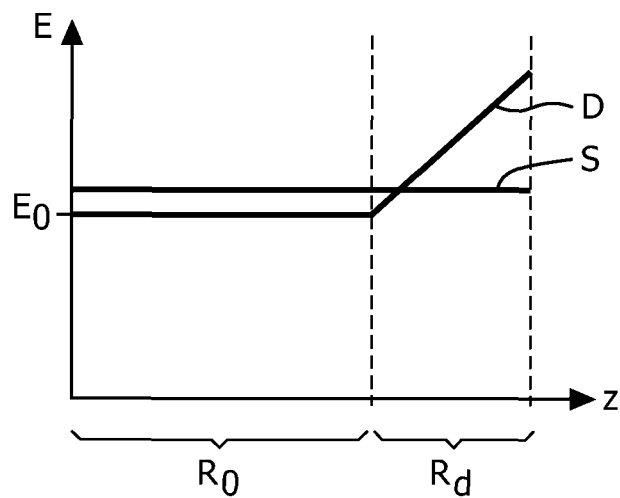
FIG. 3 is a diagram illustrating the magnitude of the electrical field in radiation detectors according to FIGS. 1 and 2.
Figure 4:
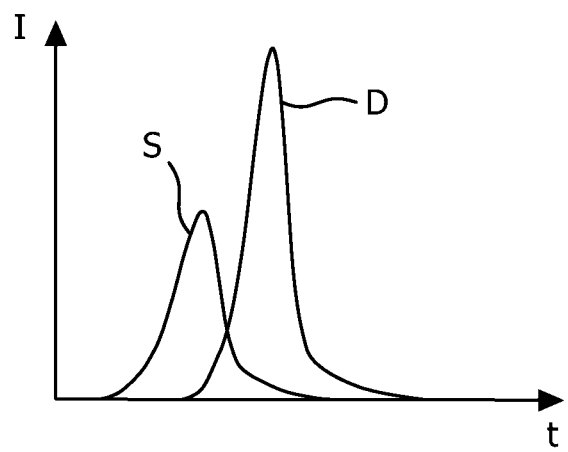
FIG. 4 is a diagram illustrating pulse shapes obtained in radiation detectors according to FIGS. 1 and 2.

In a more detailed investigation, one can assume that the direct converter element 102 has a doping concentration $\rho(z)$ of acceptors. Though a variety of doping profiles are thinkable, the discussion is restricted here to a rectangular doping profile, which means that the volume of the second region $R_0$ on the cathode side is undoped, while the volume of the first region $R_d$ is homogeneously p-doped with acceptor levels very close to the valence band level. At room temperature, most of the acceptors are negatively ionized, while the released free holes are removed after drift in the permanent electric field. The resulting electric field can be easily calculated as an integral of the function $\rho(z)$ as $$E(z) = E_1 - \frac{1}{\varepsilon_0 \varepsilon_r} \int_0^{z_{anode}} \rho(z) dz$$

where $\varepsilon_0, \varepsilon_r$ are the dielectric material constants, at z=0 is the position of the cathode, at $z=z_{anode}$ is the position of the anode array, and $E_1$ is an integration constant. Fulfilling further boundary conditions defined by the voltage $V_{bias}$ between cathode and anode, $$V_{bias} = \int_0^{z_{anode}} E(z) dz,$$

one can easily derive that the resulting electric field is still homogeneous in the undoped volume $R_0$, but with a lower absolute strength $E_0$ than in a completely undoped layer. This is illustrated in the diagram of FIG. 3, which shows the electric field strength E in an undoped material (line "S") and in a material containing a homogeneously p-doped volume $R_d$ near the anode (line "D"). In the doped layer, however, the electric field E increases linearly. If the doped volume is extended into the volume which has a relatively strong weighting potential gradient for each of the pixels, this results firstly in a slower drift of electrons in the undoped volume (which does not matter as anyway only a negligible current is induced in the anode), but secondly in a speeding up of electrons near the anode, which results in a sharper current pulse than it would be obtained for a homogeneous electric field. This is illustrated in FIG. 4, which shows current pulse shapes corresponding to the electric fields of FIG. 3.

The approach of the present invention can be applied in all kinds of energy resolving gamma- or X-ray radiation detectors, i.e. detectors for use in medical imaging applications (like Spectral X-ray or Spectral CT), industrial imaging applications for quality assurance, baggage scanning, astronomical and other detectors for scientific purposes.

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as limiting their scope.

The invention claimed is:

1. A radiation detector comprising:
    a) a converter element which converts incident high-energy radiation (X) into charge signals and divided into a first region and a second region, and the first region and the second region include a difference in composition;
    b) a cathode and an array of anodes disposed on different sides of the converter element for generating an electrical field ($E_0$, $E_d$) in the converter element;
        wherein the first region of the converter element is disposed adjacent to the array of anodes and the second region of the converter element is disposed adjacent to the cathode, and the converter element has a spatial inhomogeneity formed by the difference in the composition of the first region and the second region by which a strength of said electrical field ($E_0$, $E_d$) is increased in a first region ($R_d$) near the anode array and/or decreased in a second region ($R_0$) remote from the anode array.

2. The radiation detector according to claim 1, wherein the cathode and the anode array cover areas of substantially the same size.

3. The radiation detector according to claim 1, wherein the electrical field ($E_0$, $E_d$) is substantially directed perpendicular to planes defined by the cathode and/or the anode array.

4. The radiation detector according to claim 1, wherein the absolute of the electrical field ($E_0$, $E_d$) has a non-zero gradient that is perpendicular to planes defined by the cathode and/or the anode array.

5. The radiation detector according to claim 1, wherein the first region ($R_d$) substantially covers the relevant zone of each pixel weighting potential ($\phi$) from which the substantial part of a current pulse is induced by charge movement.

6. The radiation detector according to claim 1, wherein the converter element comprises a substrate that is doped differently in the first region from the second region with at least one dopant.

7. The radiation detector according to claim 6, wherein the concentration of the dopant is zero in one of the first region ($R_d$) and the second region ($R_0$).

8. The radiation detector according to claim 7, wherein the concentration of said dopant in the other region is homogeneous.

9. The radiation detector according to claim 6, wherein the dopant is an electron acceptor.

10. The radiation detector according to claim 6, wherein the substrate of the converter element comprises a material selected from the group consisting of Si, Se, CdTe, CZT, and PbO.

11. The radiation detector according to claim 1, wherein it comprises a readout unit for reading out charge signals generated in the converter element.

12. An examination apparatus, particularly a photon-counting energy resolved X-ray apparatus or CT scanner, comprising a radiation detector according to claim 1.

13. A method for manufacturing a radiation detector, particularly a radiation detector according to claim 1, comprising the following steps:
    a) providing a substrate that can convert high-energy radiation (X) into charge signals and the substrate is divided into a first region disposed toward a first side and a second region disposed toward a second side;
    b) doping said substrate inhomogeneously with the first region differently from the second region;
    c) applying a cathode on the second side of substrate and an array of anodes onto the first side of the substrate.

14. The method according to claim 13, wherein doping includes a dopant concentration different between the first region and the second region.

15. The method according to claim 13, wherein doping includes a zero dopant concentration in the first region and a non-zero dopant concentration in the second region.

16. The method according to claim 13, wherein doping includes a non-zero dopant concentration in the first region and a zero dopant concentration in the second region.

17. The method according to claim 13, wherein doping includes at least one of p-doping and n-doping.

18. A radiation detector comprising:
    a cathode;
    an anode array;
    a converter element which converts incident high-energy radiation (X) into charge signals and the converter element includes a first region disposed near a first side adjacent the array of anodes and a second region disposed near a second side adjacent the cathode, and the first region of converter element is different in composition with the second region, and the difference in composition generates a difference in a strength of said electrical field ($E_0$, $E_d$) between the first region ($R_d$) near the anode array and the second region ($R_0$) remote from the anode array.

19. The radiation detector according to claim 18, wherein the difference in composition is formed in a chemical composition of the converter element by at least one of:
    undoped in the first region and a non-zero concentration of a dopant in the second region; and
    a non-zero concentration of a dopant in the first region and undoped in the second region.

20. The radiation detector according to claim 19, wherein the composition of the converter element in a doped region is substantially homogeneous.

* * * * *